United States Patent
Chen et al.

(10) Patent No.: US 7,888,942 B2
(45) Date of Patent: Feb. 15, 2011

(54) DEVICES AND METHODS FOR LED LIFE TEST

(75) Inventors: Chiu-Ling Chen, Jhudong Township, Hsinchu County (TW); Sheng-Pan Huang, Changhua County (TW); Fei-Chang Hwang, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/275,341

(22) Filed: Nov. 21, 2008

(65) Prior Publication Data

US 2010/0327872 A1    Dec. 30, 2010

(30) Foreign Application Priority Data

Nov. 23, 2007    (TW) .............................. 96144508 A

(51) Int. Cl.
*G01R 31/00*    (2006.01)

(52) U.S. Cl. ..................................... 324/414

(58) Field of Classification Search ................. 324/414, 324/410, 403, 500–555; 702/57, 130, 136, 702/60, 63, 82; 315/291–309, 86, 224; 362/295
See application file for complete search history.

(56) References Cited

U.S. PATENT DOCUMENTS

| | | |
|---|---|---|
| 5,414,370 A | 5/1995 | Hashinaga |
| 6,502,044 B1 * | 12/2002 | Lane et al. ..................... 702/63 |
| 6,522,147 B1 * | 2/2003 | Pickard et al. ............. 324/414 |

* cited by examiner

*Primary Examiner*—Ha Tran T Nguyen
*Assistant Examiner*—Trung Q Nguyen
(74) *Attorney, Agent, or Firm*—Wang Law Firm; Li K. Wang

(57) ABSTRACT

A life test device comprises an oven, a current source, a voltage meter, a control module, and a process module. A light-emitting diode (LED) is disposed in the oven. The temperature of the oven is gradually changed in a first period and remains at a set temperature in a second period. The current source provides a first current and a second current to the LED. The voltage meter measures forward voltages of the LED. The control module controls the current source to output the first or second current to the LED and controls the voltage meter to measure the forward voltages of the LED. The process module calculates a junction temperature of the LED according to the forward voltages and a variation relationship formula between the forward voltages and the temperature of the oven.

36 Claims, 10 Drawing Sheets

DEVICES AND METHODS FOR LED LIFE TEST

FIELD OF THE INVENTION

The invention relates to a lifetime test equipment for semiconductor elements, and more particularly to a lifetime test equipment which estimates lifetime of light-emitting diodes (LEDs) by measuring junction temperatures of the LEDs.

DESCRIPTION OF THE RELATED ART

Driven by technological development, operation power and light-emitting efficiency of light-emitting diodes (LEDs) have been enhanced. LED applications have been developed from being used as small display backlight sources to main light sources for illumination. Solid-state lighting is the next generation of lighting sources, replacing incandescent lamps and fluorescence lamps. As demand for luminous flux and light-emitting efficiency of LEDs increase, the lifetime of LEDs become more important. Most LEDs suppliers provide estimated lifetime values of LEDs. However, different suppliers may provide different estimated lifetime values for the same type of LEDs. Moreover, different test organizations also provide different estimated lifetime values for the same type of LEDs.

LEDs are semiconductor light sources with relatively longer lifetimes. Thus, lifetime tests cannot be accomplished for a short period with normal rating operation conditions. As shown in FIG. 1, in a conventional LED lifetime test method, first, an LED is disposed on a holder 12 in an oven 11 with controllable temperature. After the temperature of the oven 11 is increased to a predetermined temperature, a power supply 13 provides a test current to the LED. By applying higher temperature and greater current than normal rating operation conditions, LED decay is accelerated. After a time period, the temperature of the oven 11 returns to a normal temperature, and the LED is taken out from the oven 11 to measure the light output of the LED. Then, the LED is disposed in the oven 11 again for a following decay test. The above decay test operations and measurement steps are repeated until the light output of the LED are decayed to a predetermined value. For LEDs with the same specification, different test temperatures and currents are used for the decay test, and various lifetime decay curves are obtained. Then, statistical calculations are performed to the various lifetime decay curves to estimate the lifetime value of these LEDs a normal rating operation condition.

However, while the temperature of the oven 11 can be controlled, both the current provided from the power supply 13 and the heat-dissipation ability of the holder 12 affect the junction temperature of the LED during the decay test, so that the temperature of the LED can not be controlled. Accordingly, for the same type of LEDs, the lifetime test results from different lifetime test systems are different.

SUMMARY OF THE INVENTION

An exemplary embodiment of a lifetime test equipment for a light-emitting diode (LED) comprises an oven, a current source, a voltage meter, a control module, and a processing module. The oven has an oven temperature. The LED is disposed in the oven. The oven gradually changes the oven temperature during a first period and sustains the oven temperature at a predetermined oven temperature point during a second period. The current source provides a first current and a second current to the LED. The voltage meter measures a forward voltage of the LED. The control module controls the current source to output the first current or the second current to the LED and controls the voltage meter to measure the forward voltage of the LED. The processing module calculates the junction temperature of the LED according to the forward voltage of the LED and a variation relationship equation between the forward voltage of the LED and the oven temperature.

Another exemplary embodiment of a lifetime test equipment for a plurality of light-emitting diodes (LEDs) comprises an oven, a control module, a first current source, a second current source, a power switch unit, a voltage meter, and a processing module. The oven has an oven temperature. The LEDs are disposed in the oven. The oven gradually changes the oven temperature during a first period and sustains the oven temperature at a predetermined oven temperature point during a second period. The control module provides a first current control signal, a second current control signal, a voltage measurement signal, and a switch signal. The first current source provides a first current according to the first current control signal. The second current source provides a plurality of second currents according to the second current control signal. Each of the second currents corresponds to one of the LEDs. The power switch unit outputs the first current or the second currents to the LEDs according to the switch signal. The voltage meter measures forward voltages of the LEDs according to the voltage measurement signal. For each of the LEDs, the processing module calculates the junction temperature of the LED according to the forward voltage of the LED and a variation relationship equation between the forward voltage of the LED and the oven temperature.

An exemplary embodiment of a lifetime test method for a light-emitting diode (LED) disposed in an oven comprises: during a first period, gradually changing an oven temperature; obtaining a variation relationship equation between a forward voltage of the LED and the oven temperature; during a second period, sustaining the oven temperature at a predetermined oven temperature point; during the second period, providing a decay test current to the LED, and at every predetermined time interval, providing a first current to the LED to obtain a forward voltage of the LED; and calculating a junction temperature of the LED according to the variation relationship equation and the obtained forward voltage.

DETAIL DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

With increase in input power, the temperature of a light-emitting diode (LED) becomes higher. Light-emitting wave length, light-emitting efficiency, and even lifetime of an LED are related to junction temperature thereof. The junction temperature Tj is represented by Equation (1):

$$Tj = T0 + \frac{Vt - V0}{K} \quad (1)$$

wherein T0 represents an initial temperature or environment reference temperature of the LED before power is input to the LED, V0 represents a forward voltage of the LED generated when a very small current is provided to the LED for a short period at the initial temperature T0, Vt represents a forward voltage of the LED generated when the temperature of the LED reaches a specific temperature point and a very small current is provided to the LED for a short period at the specific temperature, and K represents a positive temperature coefficient of the LED. K can be represented by Equation (2):

$$K = \frac{V2 - V1}{T2 - T1} \quad (2)$$

wherein, T1 and T2 represent two environment reference temperature points of the LED, and V1 and V2 represent forward voltages of the LED generated when a very small current is provided to the LED for a short period at the temperature points T1 and T2.

Thus, the invention provides a lifetime test equipment for an LED which performs not only a decay test but also measurement of a junction temperature of the LED, so that the decay test is performed at the known junction temperature.

First Embodiment

Figure 1:
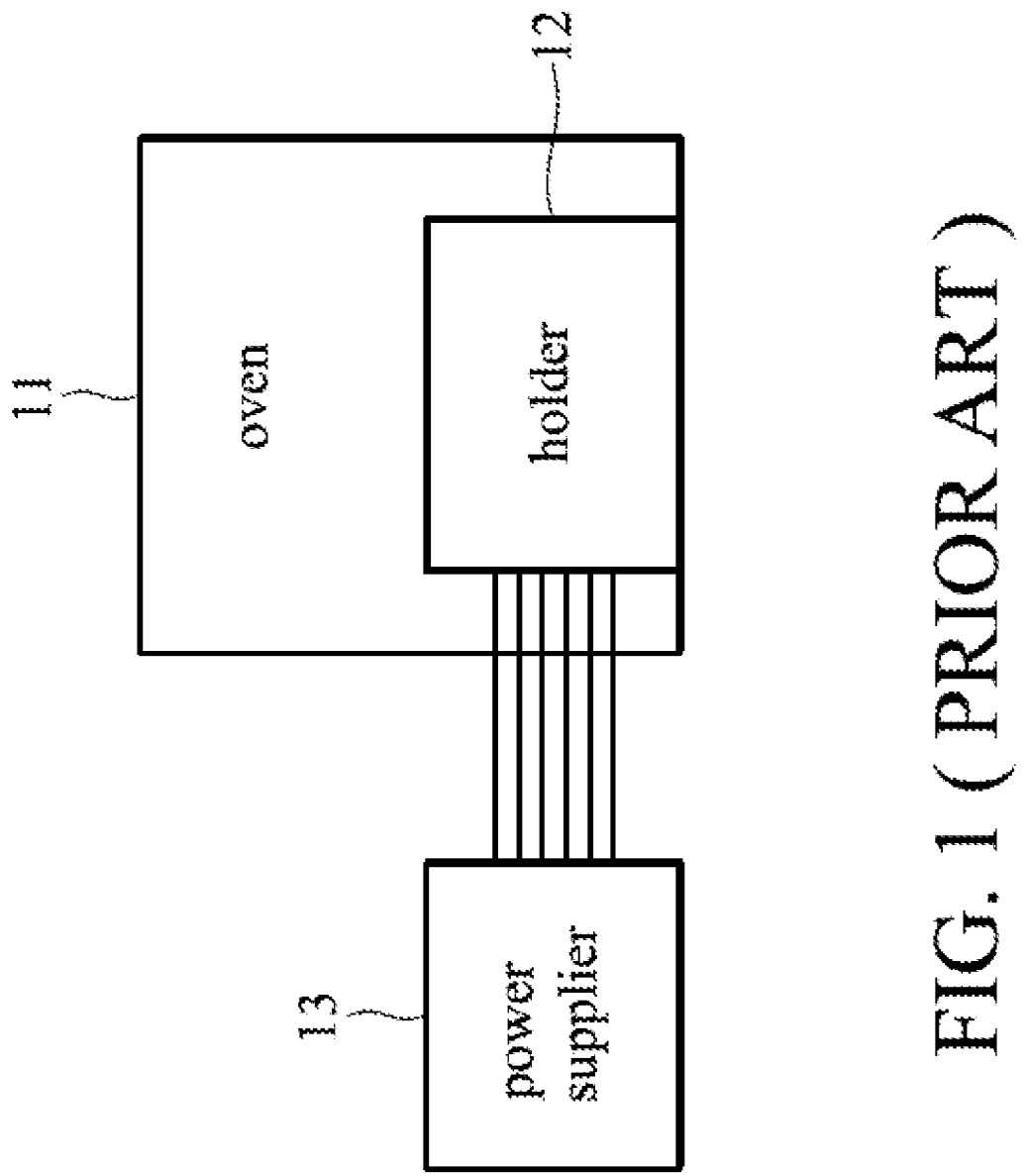
FIG. 1 shows a conventional LED lifetime test equipment.
Figure 2:
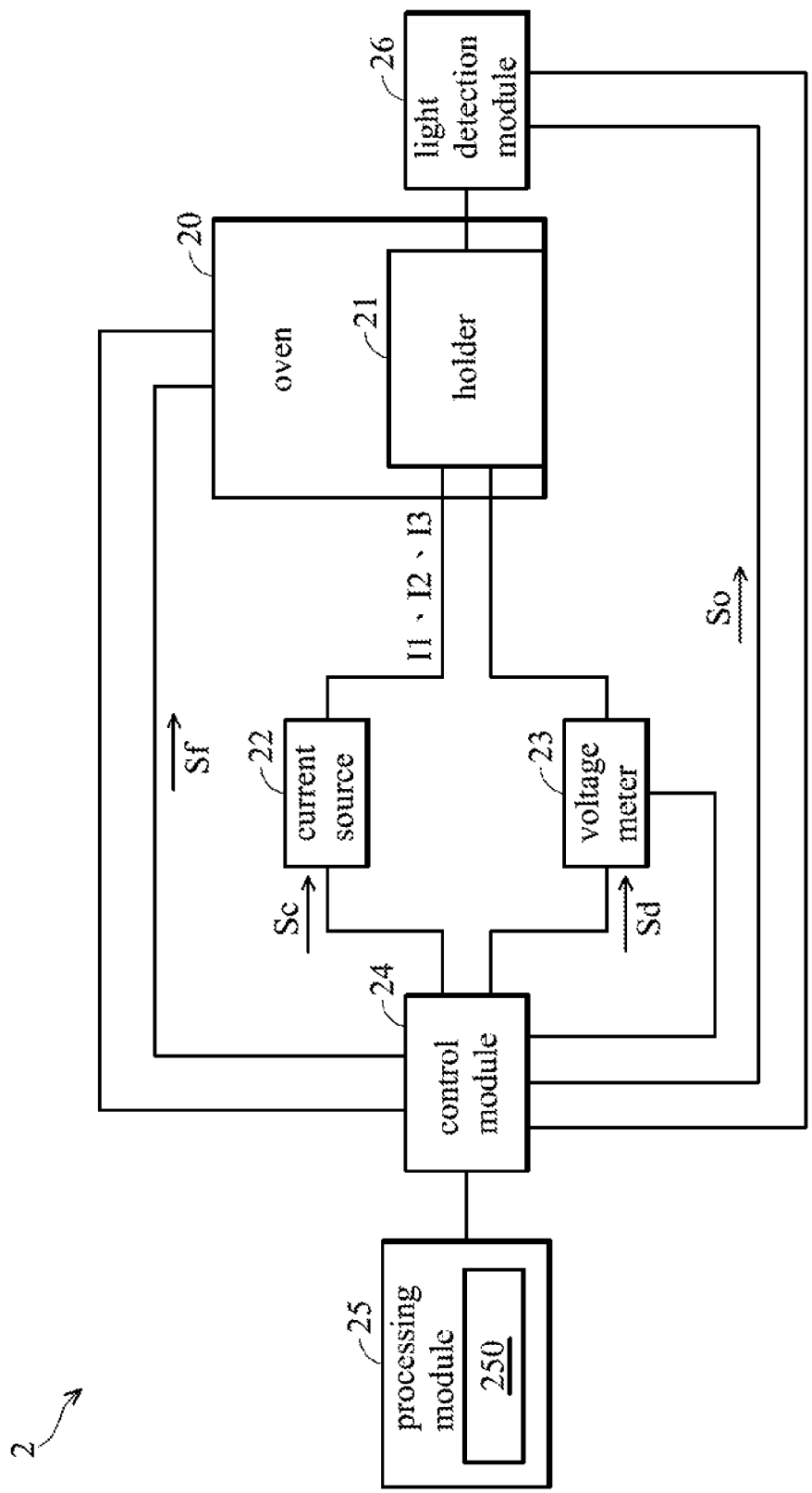
FIG. 2 shows the first embodiment of a lifetime test equipment.

FIG. 2 shows the first embodiment of a lifetime test equipment. Referring to FIG. 2, a lifetime test equipment 2 is used to test lifetime of an LED and comprises an oven 20, an LED holder 21 disposed in the oven 20, a current source 22, a voltage meter 23, a control module 24, a processing module 25, and a light detection module 26. The LED is disposed on the holder 21. The control module 24 provides a current control signal Sc to the current source 22. The control module 24 also provides a voltage measurement signal Sd for controlling the voltage meter 23 to measure a forward voltage generated by the LED and transmit the measured forward voltage to the processing modules 25. The control module 24 provides a light detection signal So for controlling the light detection module 26 to detect light output of the LED and transmit the detected light output to the processing module 25. The control module 24 further provides an oven-temperature detection signal Sf for detecting a temperature of the oven 20 and transmits the detected oven temperature to the processing module 25. The current source 22 provides three currents I1, I2, and I3 and outputs the current I1, I2, or I3 to the LED according to the current control signal Sc. The voltage meter 12 measures the forward voltage of the LED according to the voltage measurement signal Sd. The processing modules 25 calculates, stores, and displays various characteristics of the LED, such as a forward voltage, a temperature coefficient, a junction temperature, a light decay curve, and lifetime.

Figure 3:
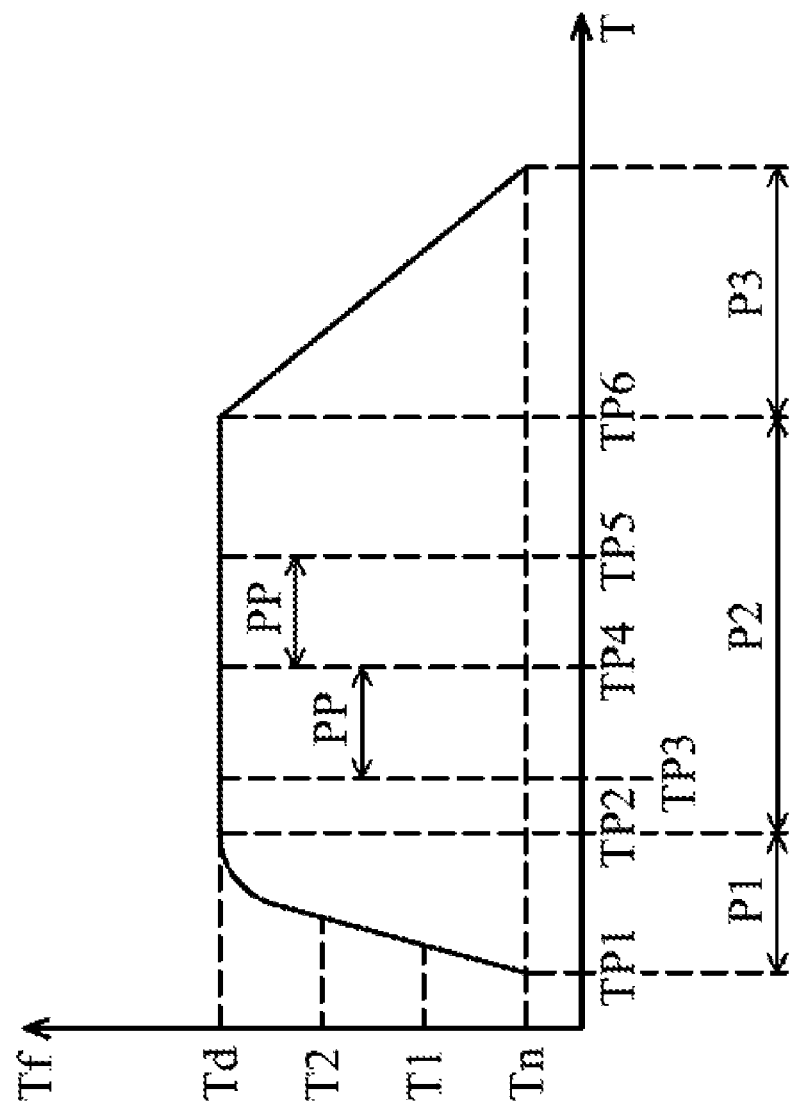
FIG. 3 is a schematic view showing a relationship between the temperature of the oven and the lifetime test process in the first embodiment.

FIG. 3 is a schematic view showing the relationship between the temperature Tf of the oven 20 and the lifetime test process in the first embodiment, wherein the lifetime test process is divided into three periods P1-P3. Referring to FIGS. 2 and 3, the operation of the lifetime test equipment of the first embodiment is described.

According to FIGS. 2 and 3, when the LED is disposed on the LED holder 21 in the oven 20, the temperature Tf of the oven 20 (hereafter referred to "oven temperature") begins rising from the normal temperature Tn at a time point TP1 until the oven temperature Tf reaches a predetermined oven temperature point Td at a time point TP2. The period when the oven temperature Tf rises to the predetermined oven temperature point Td from the normal temperature Tn is referred to a period P1. During the period P1, the current source 22 provides the current I1 to the LED for a short period at least two temperature points according to the current control signal Sc. Simultaneously, according to the voltage measurement signal Sd, the voltage meter 23 measures a forward voltage generated by the LED which is driven by the current I1 each time. The control module 24 then transmits the measured forward voltages by the voltage meter 23 to the processing module 25.

For example, at a temperature point T1, the current source 22 provides the current I1 to the LED for a short period, and the voltage meter 23 measures a forward voltage V1 of the LED. The control module 24 transmits the temperature point T1 and the measured forward voltage V1 to the processing module 25. Then, at a temperature point T2, the current source 22 provides the current I1 to the LED for a short period, and the voltage meter 23 measures a forward voltage V2 of the LED. The control module 24 transmits the temperature point T2 and the measured forward voltage V2 to the processing module 25. After receiving the forward voltages V1 and V2 and the oven temperature points T1 and T2, the processing module 25 calculates a variation relationship equation between the forward voltages V1 and V2 and the oven temperature points T1 and T2, that is Equation (2):

$$K = \frac{V2 - V1}{T2 - T1} \quad (2)$$

The variation relationship equation (2) directly represents the temperature coefficient K of the LED.

In this embodiment, the current I1 is provided to the LED at the two temperature points, and the two temperature points and two forward voltages are obtained for calculating the temperature coefficient. In other embodiments, during the period P1, the current source 22 can provide the current I1 to the LED for a short period at least three temperature points to obtain three forward voltages. The processing module 25 calculates a variation relationship equation according to the three oven temperature points and the three forward voltages for obtaining the temperature coefficient K.

During a period P2, the oven temperature Tf is sustained at the predetermined oven temperature point Td. The predetermined oven temperature point Td serves as an initial temperature point T0. When the temperature of the LED is almost equal to the oven temperature Tf (at a time point TP3), the current source 22 provides the current I1 to the LED for a short period according to the current control signal Sc. Simultaneously, according to the voltage measurement signal Sd, the voltage meter 23 measures a forward voltage generated by the LED which is driven by the current I1, and the measured forward voltage serves as an initial forward voltage V0. Then, the current source 22 is switched to provide the current I2 to the LED for a decay test according to the current control signal Sc, wherein the current I2 is greater than the current I1. After every predetermined time interval, the current source 22 is switched from the current I2 to provide the current I1 to the LED for a short period according to the current control signal Sc. Simultaneously, according to the voltage measurement signal Sd, the voltage meter 23 measures a forward voltage generated by the LED which is driven by the current I1 each time.

For example, at a time point TP4 after a predetermined time interval PP from the time point TP3, the current source 22 is switched from the current I2 to provide the current I1 to the LED for a short period. Simultaneously, the voltage meter 23 measures a forward voltage generated by the LED to serve as a forward voltage Vt. The processing module 25 calculates a junction temperature Tj at the time point TP4 by applying the temperature coefficient K from the variation relationship equation (2), the initial temperature point T0 (i.e. the predetermined oven temperature point Td), the initial forward voltage V0, and the forward voltage Vt to the above Equation (1). Then, at a time point TP5 after the predetermined time interval PP from the time point TP4, the current source 22 is switched from the current I2 to provide the current I1 to the LED for a short period. Simultaneously, the voltage meter 23 measures a forward voltage generated by the LED to serve as a forward voltage Vt. The processing module 25 calculates a junction temperature Tj at the time point TP5 by applying the temperature coefficient K from the variation relationship equation (2), the initial temperature point T0 (i.e. the predetermined oven temperature point Td), the initial forward voltage V0, and the forward voltage Vt to the above Equation (1). By repeating the operation, the current source 22 is switched from the current I2 to provide the current I1 to the LED for a short period every predetermined time interval PP, so that the junction temperatures of the LED at the different time points are obtained until a predetermined end time point TP6 of the decay test. At the predetermined end time point TP6, the current source 22 stops providing the current I2 to the LED according to the current control signal Sc to end the decay test. Then, the oven temperature Tf begins falling from the predetermined oven temperature point Td to the normal temperature Tn.

In some embodiments, the initial forward voltage V0 can be obtained before the period P1. Before the period P1, the oven temperature Tf can be sustained at the normal Tn which serves as an initial temperature point T0, and the current source 22 provides the current I1 to the LED for a short period according to the current control signal Sc. Simultaneously, according to the voltage measurement signal Sd, the voltage meter 23 measures a forward voltage generated by the LED which is driven by the current I1, and the measured forward voltage serves as an initial forward voltage V0. In other some embodiments, the obtained forward voltage and the corresponding oven temperature during the period P1 respectively serve as an initial forward voltage and an initial temperature point T0.

In some embodiments, during the period P3 when the oven temperature Tf falls from the predetermined oven temperature point Td to the normal temperature Tn, the variation relationship equation (2) between the forward voltages and the oven temperature points can be calculated to obtain the temperature coefficient K. During the period P3, the current source 22 provides the current I1 to the LED for a short period at least two temperature points according to the current control signal Sc. Simultaneously, according to the voltage measurement signal Sd, the voltage meter 23 measures a forward voltage generated by the LED which is driven by the current I1 each time. The control module 24 then transmits the obtained temperature points and the measured forward voltages to the processing module 25. The processing module 25 calculates a variation relationship equation according to the two oven temperature points and the two forward voltages for obtaining the temperature coefficient K. Since the operation for obtaining the temperature coefficient K during the period P3 is same as the period P1, the detailed description is omitted. Similarly, during the period P3, the current source 22 can provide the current I1 to the LED for a short period at least three temperature points to obtain three forward voltages. The processing module 25 calculates the variation relationship equation (2) according to the three oven temperature points and the three forward voltages for obtaining the temperature coefficient K.

According to the above description, the temperature coefficient K of the LED can be obtained during the period when the oven temperature Tf rises and/or falls. If temperature coefficients K of the LED are obtained by the variation relationship equation (2) during the period when the oven temperature Tf rises and falls, the processing module 25 calculates a final temperature coefficient by performing statistical calculations. In other some embodiments, the variation relationship equation (2) is previously known, for example, the variation relationship equation (2) is input from an external equipment or previously stored in the processing module 25. Thus, the operation of calculating the variation relationship equation (2) during the period when the oven temperature Tf rises and/or falls can be omitted. During the decay test of the period P2, at least one junction temperature is obtained by the known variation relationship equation (2) and other correlated parameters.

Figure 4:
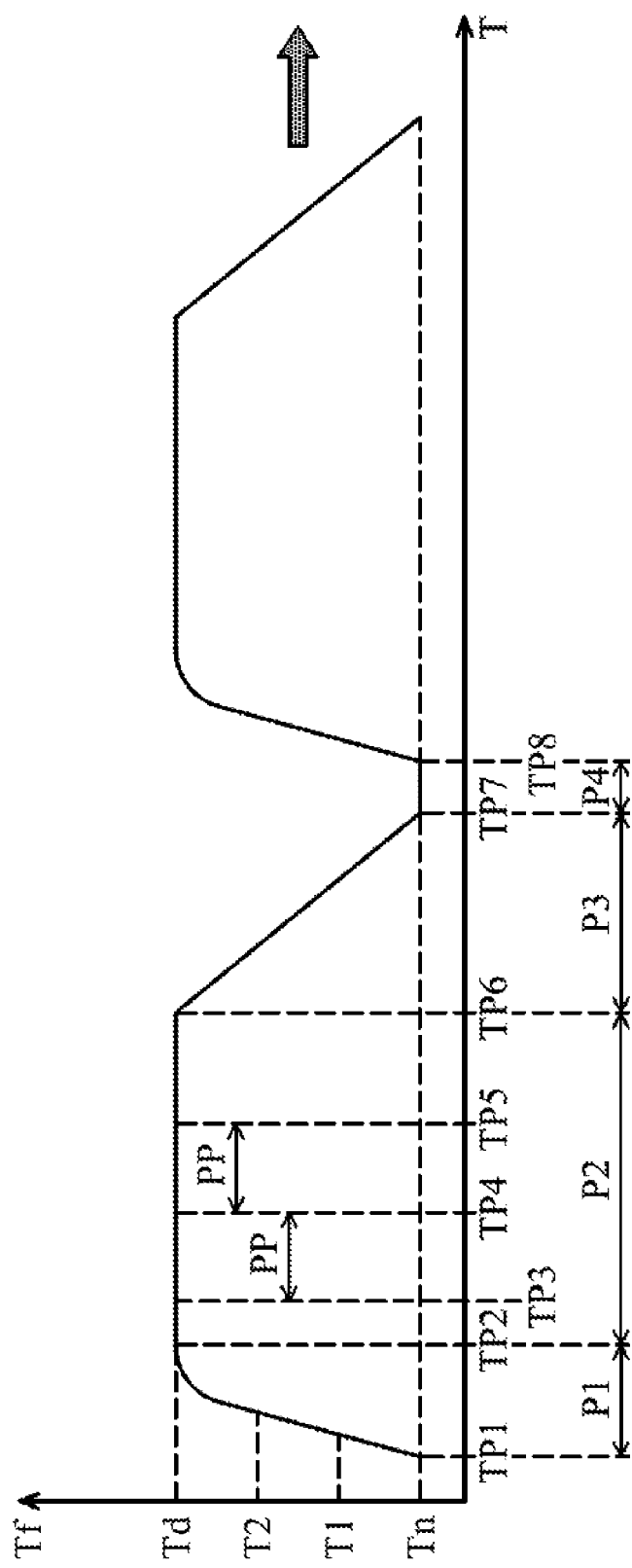
FIG. 4 is a schematic view showing another relationship between the temperature of the oven and the lifetime test process in the first embodiment.

Referring to FIG. 2, the light detection module 26 is coupled to the LED on holder 21 and controlled and detected by the control module 24. The light detection module 26 can repeatedly detect light output of the LED, such as light intensity and spectrum characteristics. The light detection module 26 can repeatedly detect the light output of the LED during the decay test of the period P2. Moreover, after the oven temperature Tf falls to the normal temperature Tn, the oven temperature Tf can remain at the normal temperature Tn for a time period. During this time period, the light detecting module 26 can also repeatedly detect the light output of the LED. Referring to FIG. 4, the oven temperature Tf falls to the normal temperature Tn at a time point TP7 and sustains at the normal temperature Tn during a period P4 between the time points TP7 and TP8. During the period P4, the control module 24 outputs the current control signal Sc, the voltage measurement signal Sd, and the light detection signal So. The current source 22 provides a predetermined current I3 to the LED according to the current control signal Sc. The voltage meter 23 measures a forward voltage Vf of the LED according to the voltage measurement signal Sd. The control module 24 transmits the measured forward voltage Vf by the voltage meter 23 to the processing modules 25. The light detection module 26 detects the light output of the LED according to the light detection signal So. The control module 24 transmits the light output of the LED detected by the light detection module 26 during the period P2 and P4 to the processing module 25. The processing module 25 calculates a variation curve of the light output vs. time at normal temperature and at a relative high temperature, and the variation curve is referred as a light decay curve. After the light detection module 26 accomplishes the photoelectric characteristic detection at normal temperature, the lifetime test equipment 2 repeats the operations of the periods P1 to P4 for continuing the LED decay test, the junction temperature measurement, and the photoelectric characteristic detection.

The processing module 25 comprises a calculation device, a storage device, and a display device 250 and calculates, stores, and displays the temperature coefficient K and the variation relationship equation (2) obtained by the oven temperature points and the LED forward voltages during the periods P1 and/or P3. The processing module 25 calculates, stores, and displays the junction temperatures of the LED and the variation curve of the junction temperatures according to the oven temperature T0 and forward voltages V0 and Vt during the period P2 and the temperature coefficient K. The processing module 25 calculates, stores, and displays required time when the LED reaches a predetermined light decay value according to the light decay curve of the light output vs. time at the normal temperature and at a relative high temperature, and the required time is referred as a lifetime of the LED. The display equipment 250 of the processing module 25 can display the light decay curve of the LED. The processing module 25 can store and display a variation curve of the forward voltage of the LED vs. time during the period P4. The processing module 25 can use lifetime values of the LED in different operation conditions (such as the junction temperature) to estimate a lifetime value in any operation condition.

According to the first embodiment, after the processing module 25 obtains the junction temperatures and the light output of the LED, the processing module 25 calculates lifetime of the LED according to the light decay curve. According to the relationship between the different junction temperatures and the LED lifetime, the lifetime values of the LED in different operation conditions can be estimated.

Second Embodiment

According to the second embodiment, the junction temperature of the LED can be obtained by another variation relationship equation between the forward voltages and the oven temperature points. During the period P1, when the processing module 25 obtains the forward voltages V1 and V2 and the oven temperature points T1 and T2, a variation relationship equation between forward voltages V1 and V2 and the oven temperature points T1 and T2 is obtained:

$$V = A*T + B \quad (3)$$

wherein V represents a forward voltage, T represents an oven temperature point, A represents the slope of the variation relationship equation (3), and B represents the intercept of the variation relationship equation (3). According to Equation (2) and Equation (3), the slope A of the variation relationship equation (3) is the temperature coefficient K.

During the period P2, the current source 22 is switched to provide the current I2 to the LED for a decay test according to the current control signal Sc. After every predetermined time interval, the current source 22 is switched from the current I2 to provide the current I1 to the LED for a short period according to the current control signal Sc. Simultaneously, according to the voltage measurement signal Sd, the voltage meter 23 measures a forward voltage generated by the LED which is driven by the current I1 each time.

For example, at the time point TP4, the current source 22 is switched from the current I2 to provide the current I1 to the LED for a short period. Simultaneously, the voltage meter 23 measures a forward voltage generated by the LED to serve as a forward voltage V. The processing module 25 applies the forward voltage V into the variation relationship equation (3) to obtain the junction temperature Tj of the LED at the time point TP4.

Thus, according to the second embodiment, the initial temperature point T0 (i.e. the predetermined oven temperature point Td) and the initial forward voltage V0 are not required. According to the variation relationship equation (3) and the forward voltage V generated by the LED which is driven by the current I1 during the period P2, the junction temperature Tj of the LED can be obtained.

Third Embodiment

Figure 5:
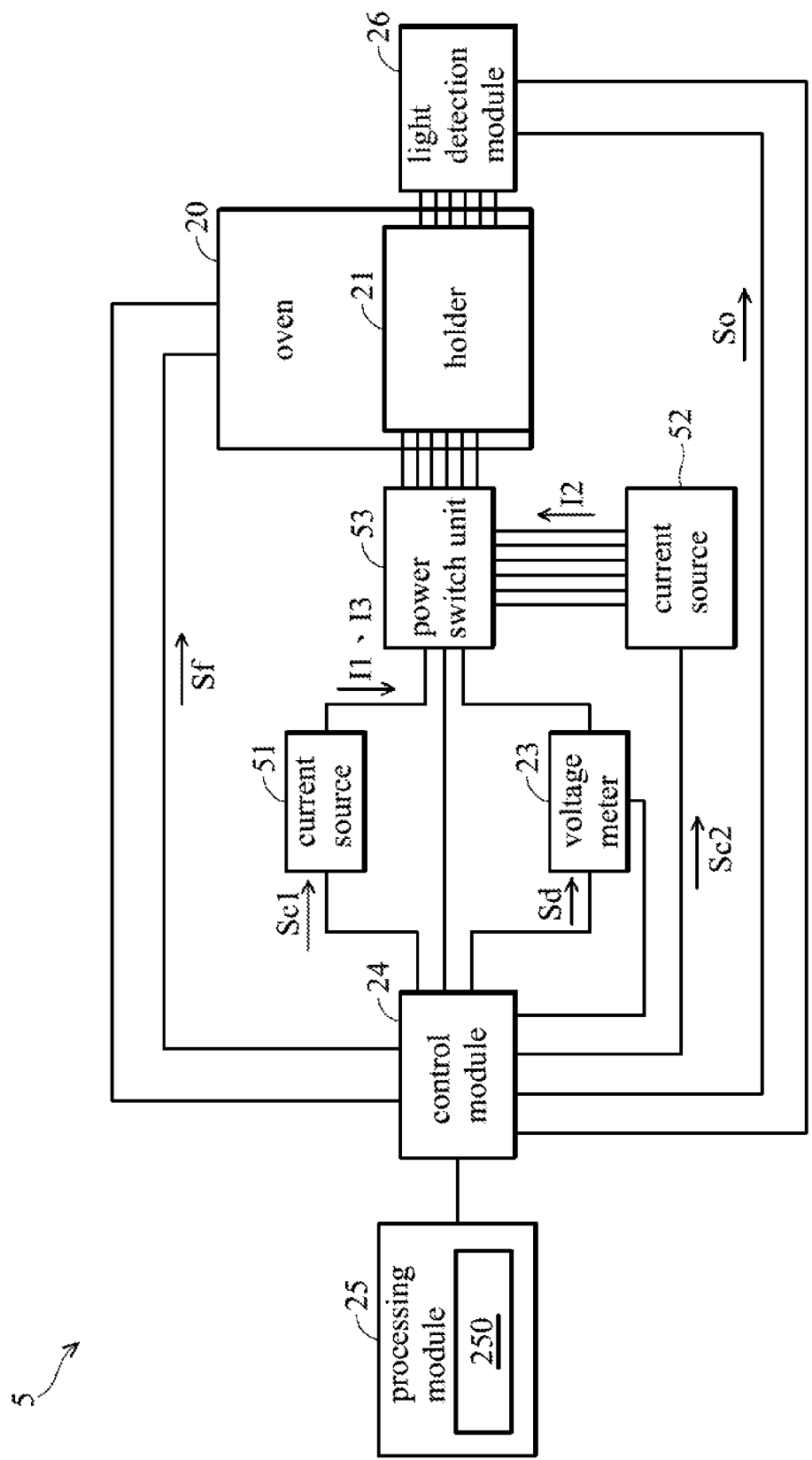
FIG. 5 shows the second exemplary embodiment of a lifetime test equipment.

FIG. 5 shows the third exemplary embodiment of a lifetime test equipment. The elements with the same references as in FIGS. 2 and 5 perform the same operations. The lifetime test equipment 5 of FIG. 5 is similar to the lifetime test equipment 2 of FIG. 2, and the difference there between is that the lifetime test equipment 5 is used to test lifetime of a plurality of LEDs. Moreover, the currents I1 and I3 and the current I2 are provided by different current sources. Referring to FIG. 5, the lifetime test equipment 5 comprises an oven 20, an LED holder 21 disposed in the oven 20, current sources 51 and 52, a power switch unit 53, a voltage meter 23, a control module 24, a processing module 25, and a light detection module 26. The LEDs are disposed on the LED holder 21. The control module 24 provides a current control signal Sc1 to the current source 51 and a current control signal Sc2 to the current source 52. The control module 24 provides a voltage measurement signal Sd for controlling the voltage meter 23 to measure the forward voltages of the LEDs and transmit the measured forward voltages to the processing module 25. The control module 24 provides a light detection signal So for controlling the light detection module 26 to detect light output of the LEDs and transmit the detected light output to the processing module 25. The control module 24 further provides an oven-temperature detection signal Sf for detecting a temperature of the oven 20 and transmits the detected oven temperature to the processing module 25. The control module 24 provides a switch signal Ssw to the power switch unit 53. The current source 51 provides the current I1 or I3 according to the current control signal Sc1. The current source 52 provides the current I2 according to the current control signal Sc2. The power switch unit 53 outputs the current I1, I2, or I3 to the LEDs according to the switch signal Ssw.

In the third embodiment, the operations of the lifetime test equipment 5 during the periods P1 to P4 for each LED are almost similar to the lifetime test equipment 2. The different is that the power switch unit 53 outputs the current I1, I2, or I3 to each LED according to the switch signal Ssw. When the temperature Tf of the oven 20 rises and for falls, that is during the periods P1 and/or P3, for each LED, the current source 51 provides the current I1 according to the current control Sc1, and the power switch unit 53 outputs the current I1 to the LED for a short period at least two temperature points according to the switch signal Ssw. The processing module 25 calculates the variation relationship equation (2) according to the two temperature points and the corresponding forward voltages to further obtain the temperature coefficient K.

During the period P2, when it is desired to obtain an initial forward voltage V0 before the decay test and obtain a forward voltage Vt during the decay test for each LED, the current source 51 provides the current I1 according to the current control signal Sc1, and the power switch unit 53 outputs the current I1 to the LED for a short period according to the switch signal Ssw. When the decay test of the LEDs is performed, the current source 52 provides the current I2 according to the current control signal Sc2, and the power switch unit 53 outputs the current I2 to each LED according to the switch signal Ssw. Since the lifetime test equipment 5 is used to test lifetime of a plurality of LEDs, the current I2 has different values for different LEDs in the decay test of various test conditions.

Figure 6A:
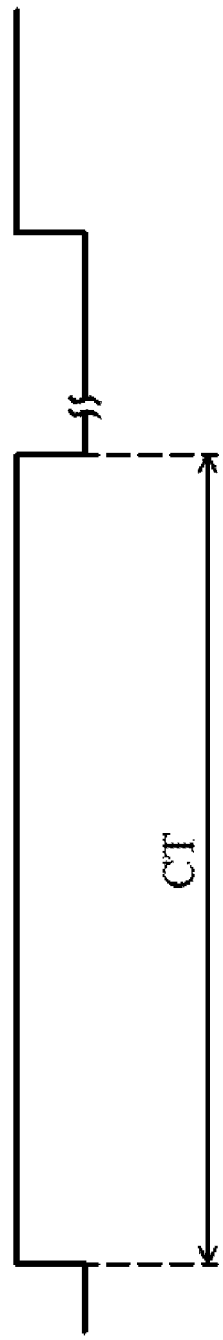
FIGS. 6a and 6b show current waveforms in decay test according to the embodiment.
Figure 6B:
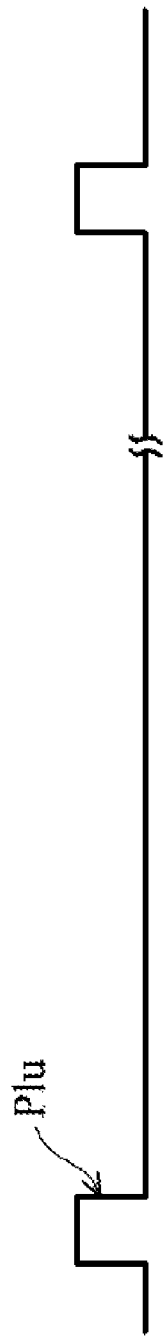

In the first, second, third embodiments, the values of the currents I1, I2, and I3 are determined according to the setting of the lifetime test equipment and the specification of the LEDs. In some embodiments, the current I1 is about 5 μA-5 mA. Each of the currents I2 and I3 is about 5 mA-5 A. The current I2 of the decay test can be a constant current according to the specification of the LEDs, referring to FIG. 6a, the value of the current I2 is at a fixed level during the period CT. In some embodiments, as shown in FIG. 6b, each time when the current I2 is provided to drive the LEDs, the current I2 is a pulse Plu.

Figure 7:
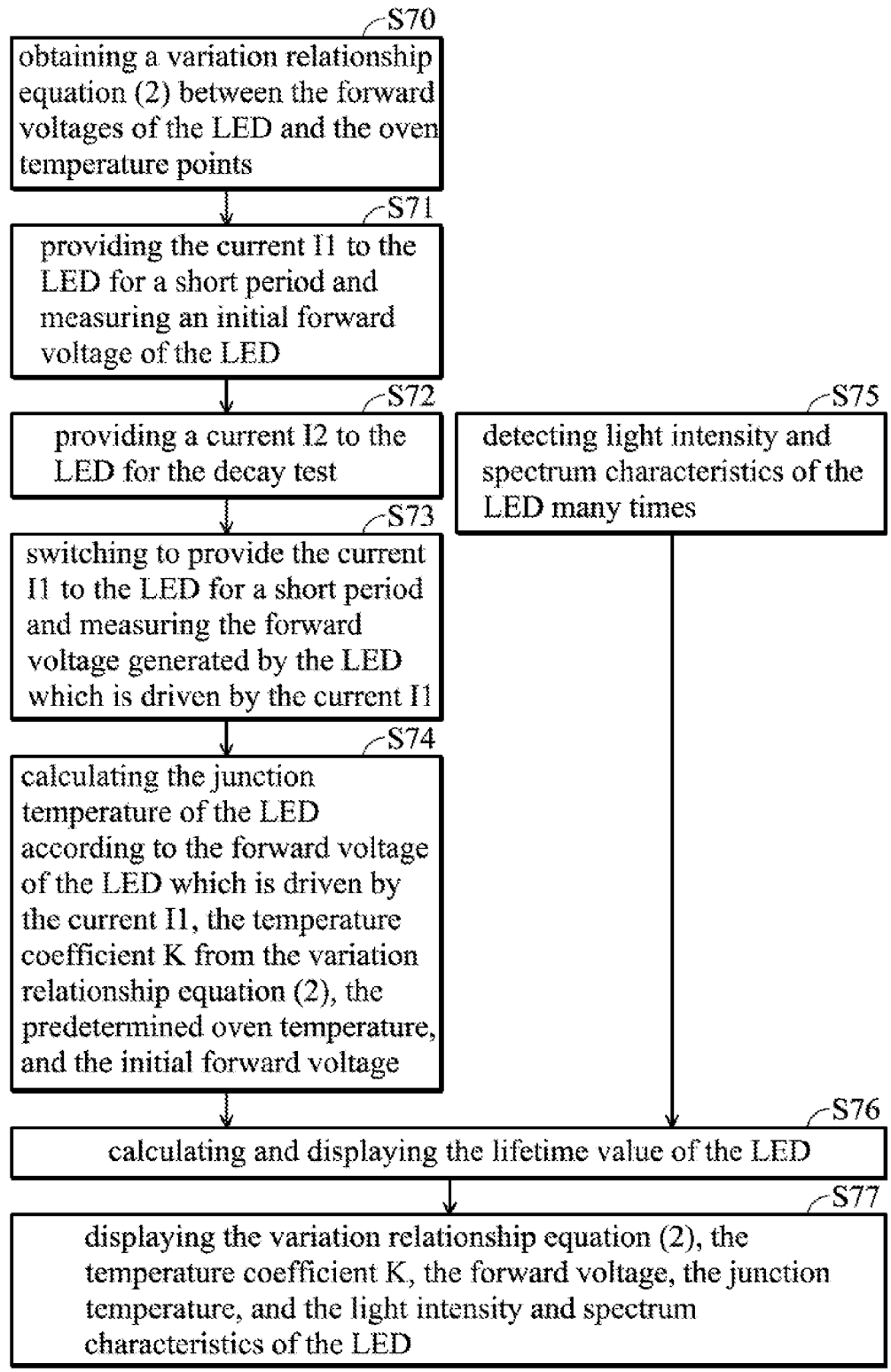
FIG. 7 is a flow chart of an exemplary embodiment of a lifetime test method for an LED.

FIG. 7 is a flow chart of an exemplary embodiment of a lifetime test method for an LED. The lifetime test method will be described according to FIGS. 2 and 7. The LED to be test is disposed on the holder 21 in the oven 20. A variation relationship equation (2) between the forward voltages of the LED and the oven temperature points is obtained (step S70), wherein the variation relationship equation (2) represents the temperature coefficient K of the LED. When the temperature of the oven 20 (hereafter referred to "oven temperature") is sustained at a predetermined oven temperature point and the temperature of the LED is almost equal to the oven temperature, the current source 22 provides the current I1 to the LED for a short period, so that the LED generates an initial forward voltage (step S71). Then, the current source 22 provides a current I2 to the LED for the decay test (step S72). During the decay test, at every predetermined time interval, the current source 22 is switched to provide the current I1 to the LED for a short period, and at least one forward voltage generated by the LED which is driven by the current I1 is measured (step S73). The processing module 25 calculates at least one junction temperature of the LED according to the forward voltage of the LED which is driven by the current I1, the temperature coefficient K from the variation relationship equation (2), the predetermined oven temperature point, and the initial forward voltage (step S74). The light detection module 26 detects light intensity and spectrum characteristics of the LED many times (step S75). The processing module 25 calculates the lifetime value of the LED according to the light intensity and spectrum characteristics of the LED and the junction temperature (step S76). The display equipment 250 of the processing module 25 displays the variation relationship equation (2), the temperature coefficient K, the forward voltage, the junction temperature, and the light intensity and spectrum characteristics of the LED (step S77). Moreover, the display equipment 250 also displays the lifetime value of the LED obtained in the step S76.

In some embodiments, in the step S70 for obtaining the temperature coefficient K of the LED, the temperature coefficient K can be input from an external device or a processing module 25 with a previously stored variation relationship equation (2).

Figure 8:
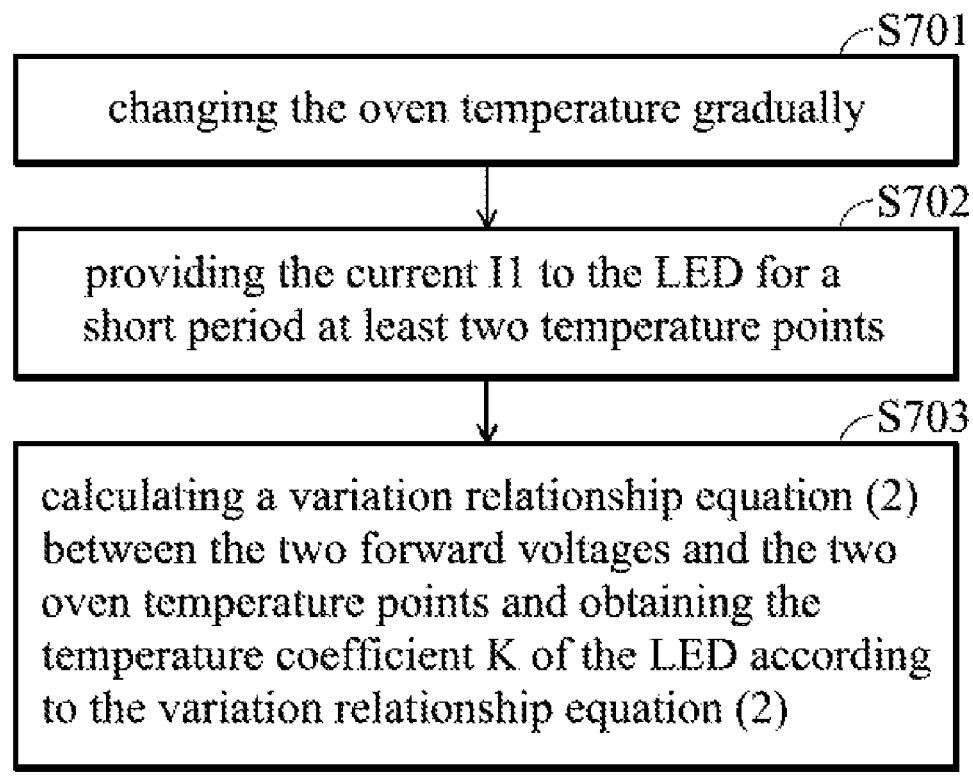
FIG. 8 is an example for obtaining a variation relationship equation between the forward voltage and the oven temperature point.

In other some embodiments, the temperature coefficient K of the LED is obtained by the forward voltages generated by the LED which is driven by the current I1. FIG. 8 is a flow chart of an exemplary embodiment of the step S70 of FIG. 7. The temperature of the oven 20 rises or falls gradually (step S701). When the temperature of the oven 20 changes gradually, the current source 22 provides the current I1 to the LED for a short period at least two temperature points, so that the LED generates at least two forward voltages (step S702). The processing module 25 calculates a variation relationship equation (2) between the two forward voltages and the two oven temperature points and obtains the temperature coefficient K of the LED according to the variation relationship equation (2) (step S703). In the embodiment, if the current source 22 provides the current I1 to the LED for a short period at least three temperature points, the processing module 25 calculates a variation relationship equation according to the three oven temperature points and the three forward voltages for obtaining the temperature coefficient K.

Figure 9:
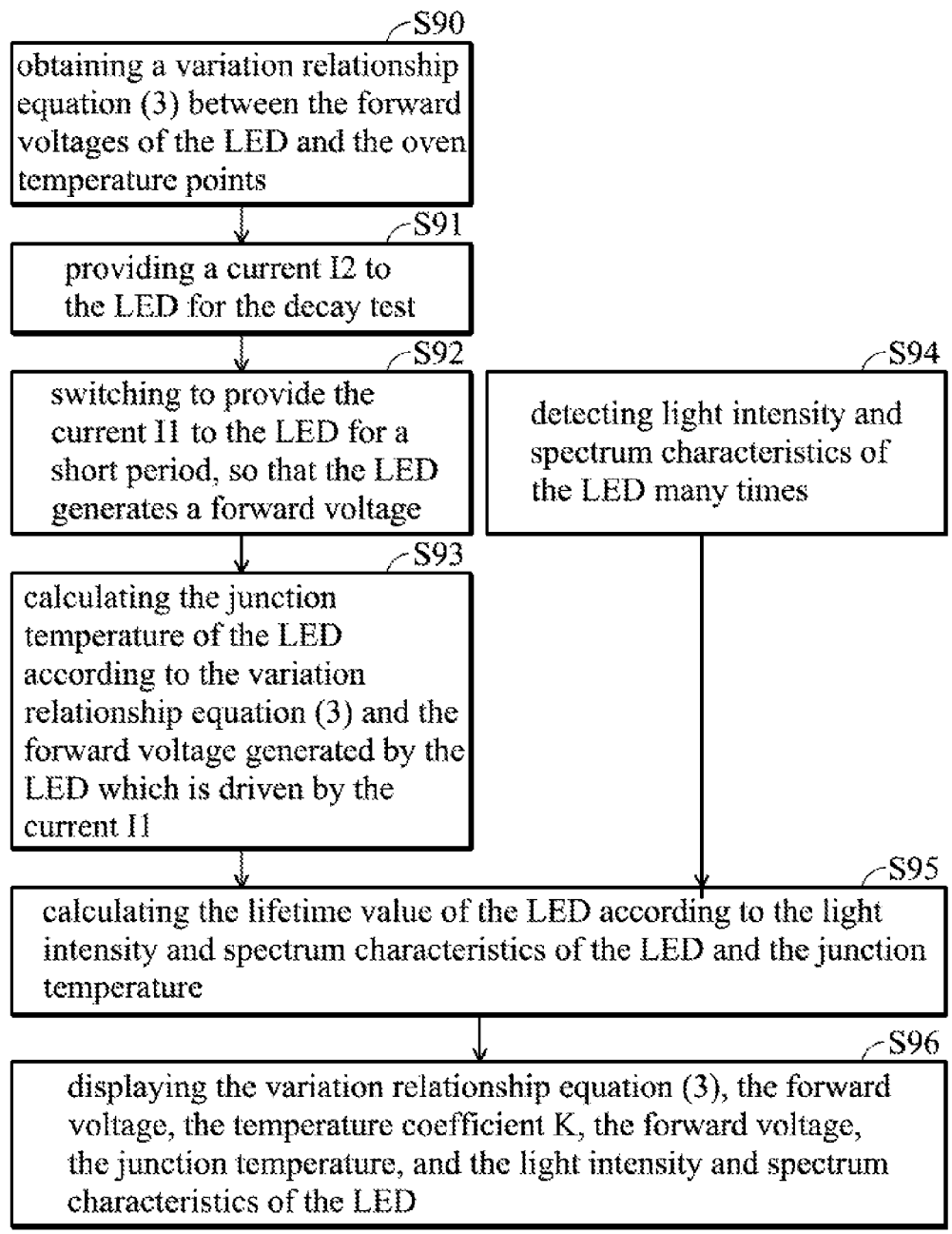
FIG. 9 is a flow chart of another exemplary embodiment of a lifetime test method for an LED.

FIG. 9 is a flow chart of another exemplary embodiment of a lifetime test method for an LED. The lifetime test method will be described according to FIGS. 2 and 9. The LED to be tested is disposed on the holder 21 in the oven 20. A variation relationship equation (3) between the forward voltages of the LED and the oven temperature points is obtained (step S90). The current source 22 provides a current I2 to the LED for the decay test (step S91). During the decay test, at every predetermined time interval, the current source 22 is switched to provide the current I1 to the LED for a short period, so that the LED generates a forward voltage (step S92). The processing module 25 calculates the junction temperature of the LED according to the variation relationship equation (3) and the forward voltage generated by the LED which is driven by the current I1 (step S93). The light detection module 26 detects light intensity and spectrum characteristics of the LED many times (step S94). The processing module 25 calculates the lifetime value of the LED according to the light intensity and spectrum characteristics of the LED and the junction temperature (step S95). The display equipment 250 of the processing module 25 displays the variation relationship equation (3), the forward voltage, the junction temperature, and the light intensity and spectrum characteristics of the LED (step S96). Moreover, the display equipment 250 also displays the lifetime value of the LED obtained in the step S95.

Figure 10:
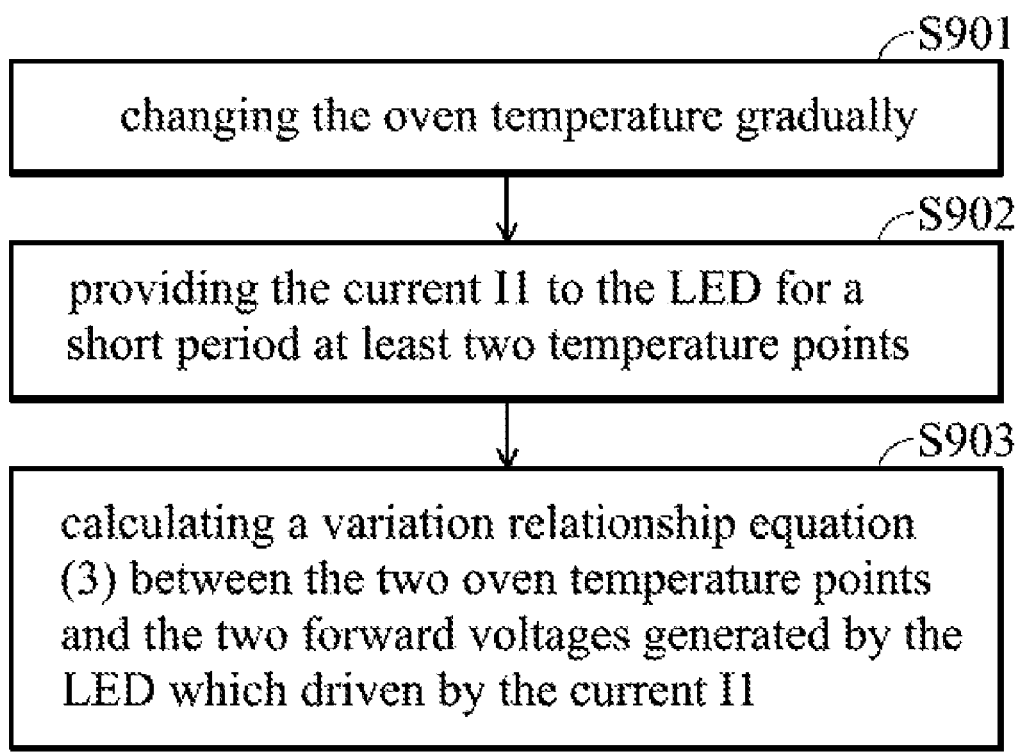
FIG. 10 is another example for obtaining a variation relationship equation between the forward voltage and the oven temperature point.

In some embodiments, the variation relationship equation between the forward voltages of the LED and the oven temperature points is obtained by the forward voltage generated by the LED which is driven by the current I1. FIG. 10 is a flow chart of an exemplary embodiment of the step S90 of FIG. 9. The temperature of the oven 20 rises or falls gradually (step S901). When the temperature of the oven 20 changes gradually, the current source 22 provides the current I1 to the LED for a short period at least two temperature points, so that the LED generates at least two forward voltages (step S902). The processing module 25 calculates a variation relationship equation (3) between the two oven temperature points and the two forward voltages generated by the LED which is driven by the current I1 (step S903).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

SYMBOL DESCRIPTION OF THE MAIN ELEMENTS

11~oven;
12~holder;
13~current supply;
2~lifetime test equipment;
20~oven;
21~LED holder;
22~current source;
23~voltage meter;
24~control module;
25~processing module;
26~light detection module;
250~display device;
Sc~current control signal;
Sd~voltage measurement signal;
So~light detection signal;
Sf~oven-temperature detection signal;
51-52~current source;
53~power switch unit;
Sc1-Sc2~current control signal;
Ssw~switch signal.

SYMBOL DESCRIPTION OF FIG. 2

2~lifetime test equipment;
20~oven;
21~LED holder;
22~current source;
23~voltage meter;
24~control module;
25~processing module;
26~light detection module;
250~display device;
Sc~current control signal;
Sd~voltage measurement signal;
So~light detection signal;
Sf~oven-temperature detection signal.

The invention claimed is:

1. A lifetime test equipment for a light-emitting diode (LED) comprising:
an oven having an oven temperature, wherein the LED is disposed in the oven, the oven gradually changes the oven temperature during a first period and sustains the oven temperature at a predetermined oven temperature point during a second period;
a current source for providing a first current and a second current to the LED;
a voltage meter for measuring a forward voltage of the LED;
a control module for controlling the current source to output the first current or the second current to the LED and controlling the voltage meter to measure the forward voltage of the LED; and
a processing module for calculating a junction temperature of the LED according to the forward voltage of the LED and a variation relationship equation between the forward voltage of the LED and the oven temperature.

2. The lifetime test equipment as claimed in claim 1, wherein during the first period, the current source provides the first current to the LED for a short period at least two temperature points, and the LED accordingly generates at least two first forward voltages.

3. The lifetime test equipment as claimed in claim 2, wherein the processing module calculates the variation relationship equation according to the at least two temperature points and the at least two first forward voltages.

4. The lifetime test equipment as claimed in claim 3, wherein the variation relationship equation is a one-variable linear equation.

5. The lifetime test equipment as claimed in claim 1, wherein the variation relationship equation is input from an external equipment or previously stored in the processing module.

6. The lifetime test equipment as claimed in claim 1, wherein before the first period, the oven temperature is sustained at a normal temperature, or during the first or second period, the current source provides the first current to the LED, so that the LED generates an initial forward voltage.

7. The lifetime test equipment as claimed in claim 6, wherein during the second period, the current source is switched to provide the second current to the LED, and at every predetermined time interval, the current source is switched to provide the first current to the LED, so that the LED generates a second forward voltage.

8. The lifetime test equipment as claimed in claim 7, wherein at every predetermined time interval, the processing module calculates the junction temperature according to the variation relationship equation, the corresponding second forward voltage, the initial forward voltage, and the corresponding oven temperature.

9. The lifetime test equipment as claimed in claim 1, wherein during the second period, the current source is switched to provide the second current to the LED, and at every predetermined time interval, the current source is switched to provide the first current to the LED, so that the LED generates a second forward voltage.

10. The lifetime test equipment as claimed in claim 9, wherein at every predetermined time interval, the processing module calculates the junction temperature according to the variation relationship equation and the corresponding second forward voltage.

11. The lifetime test equipment as claimed in claim 1, wherein the second current provided from current source is a direct-current type or pulse type current.

12. The lifetime test equipment as claimed in claim 1 further comprising a light detection module for repeatedly detecting light intensity and spectrum characteristics of the LED.

13. The lifetime test equipment as claimed in claim 12, wherein the processing module calculates, stores, and displays the variation relationship equation, the forward voltage of the LED, the junction temperature, and the light intensity and spectrum characteristics of the LED.

14. The lifetime test equipment as claimed in claim 12, wherein the processing module calculates, stores, and displays a lifetime value of the LED according to the light intensity and spectrum characteristics of the LED and the junction temperature.

15. A lifetime test equipment for a plurality of light-emitting diodes (LEDs) comprising:
an oven having an oven temperature, wherein the LEDs are disposed in the oven, the oven gradually changes the oven temperature during a first period and sustains the oven temperature at a predetermined oven temperature point during a second period;
a control module for providing a first current control signal, a second current control signal, a voltage measurement signal, and a switch signal;
a first current source for providing a first current according to the first current control signal;
a second current source for providing a plurality of second currents according to the second current control signal, wherein each of the second currents corresponds to one of the LEDs;

a power switch unit for outputting the first current or the second currents to the LEDs according to the switch signal;

a voltage meter for measuring forward voltages of the LEDs according to the voltage measurement signal; and a processing module;

wherein for each of the LEDs, the processing module calculates a junction temperature of the LED according to the forward voltage of the LED and a variation relationship equation between the forward voltage of the LED and the oven temperature.

16. The lifetime test equipment as claimed in claim 15, wherein for each of the LEDs, during the first period, the first current source provides the first current according to the first current control signal and the power switch unit outputs the first current to the LED at least two temperature points, and the LED accordingly generates at least two first forward voltages.

17. The lifetime test equipment as claimed in claim 16, wherein for each of the LEDs, the processing module calculates the variation relationship equation according to the at least two temperature points and the at least two first forward voltages.

18. The lifetime test equipment as claimed in claim 16, wherein the variation relationship equation for each of the LEDs is a one-variable linear equation.

19. The lifetime test equipment as claimed in claim 15, wherein the variation relationship equation for each of the LEDs is input from an external equipment or previously stored in the processing module.

20. The lifetime test equipment as claimed in claim 15, wherein for each of the LEDs, before the first period, the oven temperature is sustained at a normal temperature, or during the first or second period, the first current source provides the first current according to the first current control signal and the power switch unit outputs the first current to the LED according to the switch signal, so that the LED generates an initial forward voltage.

21. The lifetime test equipment as claimed in claim 20, wherein during the second period, the second current source provides the second current according to the second current control signal and the power switch unit outputs the second current to the LED according to the switch signal, and at every predetermined time interval, the first current source provides the first current according to the first current control signal and the power switch unit outputs the first current to the LED according to the switch signal, so that the LED generates a second forward voltage.

22. The lifetime test equipment as claimed in claim 21, wherein at every predetermined time interval, the processing module calculates the junction temperature according to the variation relationship equation, the corresponding second forward voltage, the initial forward voltage, and the oven temperature.

23. The lifetime test equipment as claimed in claim 15, wherein for each of the LEDs, during the second period, the second current source provides the second current according to the second current control signal and the power switch unit outputs the second current to the LED according to the switch signal, and at every predetermined time interval, the first current source provides the first current according to the first current control signal, and the power switch unit outputs the first current to the LED according to the switch signal, so that the LED generates a second forward voltage.

24. The lifetime test equipment as claimed in claim 23, wherein at every predetermined time interval, the processing module calculates the junction temperature according to the variation relationship equation and the corresponding second forward voltage.

25. The lifetime test equipment as claimed in claim 15, wherein the second current provided from current source is a direct-current type or pulse type current.

26. The lifetime test equipment as claimed in claim 15 further comprising a light detection module for repeatedly detecting light intensity and spectrum characteristics of the LEDs.

27. The lifetime test equipment as claimed in claim 26, wherein the processing module calculates, stores, and displays the variation relationship equations, the forward voltages, and the junction temperatures of the LEDs and the light intensity and spectrum characteristics of the LEDs.

28. The lifetime test equipment as claimed in claim 26, wherein the processing module calculates, stores, and displays lifetime values of the LEDs according to the light intensity and spectrum characteristics of the LEDs and the junction temperatures.

29. A lifetime test method for a light-emitting diode (LED) disposed in an oven, comprising:

during a first period, gradually changing an oven temperature;

obtaining a variation relationship equation between a forward voltage of the LED and the oven temperature;

during a second period, sustaining the oven temperature at a predetermined oven temperature point;

during the second period, providing a decay test current to the LED, and at every predetermined time interval, providing a first current to the LED to obtain a forward voltage of the LED; and calculating a junction temperature of the LED according to the variation relationship equation and the obtained forward voltage.

30. The lifetime test method as claimed in claim 29 further comprising:

during the first period, providing the first current to the LED at least two temperature points, so that the LED generates at least two first forward voltages; and calculating the variation relationship equation according to the at least two temperature points and the at least two first forward voltages.

31. The lifetime test method as claimed in claim 30, wherein the variation relationship equation is a one-variable linear equation.

32. The lifetime test method as claimed in claim 29, wherein the variation relationship equation is input from an external device.

33. The lifetime test method as claimed in claim 29 further comprising:

sustaining the oven temperature at a normal temperature before the first period, or providing the first current to the LED during the first or second period, so that the LED generates an initial forward voltage; and during the second period, at every predetermined time interval, calculating the junction temperature according to the variation relationship equation, the initial forward voltage, and the corresponding oven temperature.

34. The lifetime test method as claimed in claim 29 further comprising repeatedly detecting light intensity and spectrum characteristics of the LED.

35. The lifetime test method as claimed in claim 29 further comprising calculating, storing, and displaying a lifetime value of the LED according to light intensity and spectrum characteristics of the LED and the junction temperature.

36. The lifetime test method as claimed in claim 29 further comprising calculating, storing, and displaying the variation relationship equation, the forward voltage of the LED, the junction temperature, and light intensity and spectrum characteristics of the LED.

* * * * *